(12) United States Patent
Stanley et al.

(10) Patent No.: US 7,430,119 B2
(45) Date of Patent: Sep. 30, 2008

(54) IMPELLER AND ALIGNED COLD PLATE

(75) Inventors: Gavin D. Stanley, Puyallup, WA (US); Kazimierz L. Kozyra, Olympia, WA (US); Daniel P. Carter, Bainbridge Island, WA (US); Michael T. Crocker, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 225 days.

(21) Appl. No.: 11/540,224

(22) Filed: Sep. 29, 2006

(65) Prior Publication Data
US 2008/0080139 A1 Apr. 3, 2008

(51) Int. Cl.
H05K 7/20 (2006.01)
F28D 15/00 (2006.01)
H01L 23/34 (2006.01)
F01D 5/08 (2006.01)

(52) U.S. Cl. ............ 361/702; 361/698; 361/699; 165/80.2; 165/80.4; 165/104.33; 174/15.1; 257/714; 416/95

(58) Field of Classification Search .......... 361/689, 361/698–699, 701–703; 165/80.4, 80.2, 165/120–122, 104.33; 174/15.1; 257/713–714; 416/95
See application file for complete search history.

(56) References Cited

U.S. PATENT DOCUMENTS

| | | | | |
|---|---|---|---|---|
| 6,408,937 B1 * | 6/2002 | Roy | | 165/104.33 |
| 6,894,899 B2 * | 5/2005 | Wu et al. | | 361/699 |
| 7,117,931 B2 * | 10/2006 | Crocker et al. | | 165/104.33 |
| 7,143,820 B2 * | 12/2006 | Crocker et al. | | 165/104.33 |
| 7,262,967 B2 * | 8/2007 | Crocker et al. | | 361/699 |
| 7,273,090 B2 * | 9/2007 | Crocker et al. | | 165/104.33 |
| 2005/0241804 A1 * | 11/2005 | Lee et al. | | 165/80.4 |
| 2005/0243518 A1 * | 11/2005 | Hata et al. | | 361/699 |
| 2006/0144569 A1 | 7/2006 | Crocker et al. | | |
| 2006/0144570 A1 | 7/2006 | Crocker et al. | | |
| 2007/0077155 A1 * | 4/2007 | Shah et al. | | 417/353 |

OTHER PUBLICATIONS

White Paper, "Important Assembly Instructions", (was not disclosed until after the filing date). Intel® Advanced Liquid Cooling Technology (ALCT) Thermal Solution for the Intel® Processor. Revision 1.1—Sep. 21, 2006. 8pgs.

CeBit Trade Show, "Cool down your processor-and your budget", Mar. 9, 2006. Novel Cooling Solution with Intel® Advanced Liquid Cooling Technology (Intel® ALCT), Intel Leap ahead™. 4pgs.

(Continued)

*Primary Examiner*—Jayprakash N Gandhi
*Assistant Examiner*—Zachary M Pape
(74) *Attorney, Agent, or Firm*—Buckley, Maschoff & Talwalkar LLC

(57) ABSTRACT

According to some embodiments, an apparatus may comprise a cold plate comprising a plurality of fins and an impeller comprising a plurality of blades. An output fluid velocity angle defined by the plurality of fins may be aligned to an impeller inlet velocity angle. The impeller inlet velocity angle may be based on an operational speed of the plurality of blades and an angle of the plurality of blades with respect to a center of the impeller.

20 Claims, 5 Drawing Sheets

OTHER PUBLICATIONS

Gavin Stanley, "Thermal/Mechanical Engineer User-centered Platform Solutions Division", Intel Developer FORUM, Intel Leap ahead™. Intel® Advanced Liquid Cooling Technology, Mar. 6, 2006, 25pgs.

Crocker, Michael T. et al., U.S. Appl. No. 11/170,492, entitled "Systems for Low Cost Coaxial Liquid Cooling", filed Jun. 29, 2005.

Crocker, Michael T. et al., U.S. Appl. No. 11/170,425, entitled "Systems for Integrated Cold Plate and Heat Spreader", filed Jun. 29, 2005.

Crocker, Michael T. et al., U.S. Appl. No. 11/170,427, entitled "Systems for Integrated Pump and Reservoir" filed Jun. 29, 2005.

Shah, Ketan R. et al., U.S. Appl. No. 11/241,624, entitled "Hydrodynamic Bearing in Centrifugal Pump Through the Implementation of a Double Involute and Close Tolerances" filed Sep. 30, 2005.

* cited by examiner

Receive fluid at a cold plate comprising a plurality of fins
501

Transfer fluid from the cold plate to an impeller, wherein the impeller comprises a plurality of blades, wherein an output fluid velocity angle of the cold plate is aligned with an impeller inlet velocity angle, and wherein the impeller inlet velocity angle is based on a speed of the plurality of blades and an angle of the plurality of blades with respect to a center point of a diameter of the impeller.
502

IMPELLER AND ALIGNED COLD PLATE

BACKGROUND

Electrical devices, such as computers, are comprised of multiple electrical components (e.g., processors and memory devices) that typically dissipate unused electrical energy as heat, which may damage the electrical components. Various means, such as heat sinks and heat exchangers, have been utilized to control and/or remove heat from electrical components and their surroundings.

As electrical devices increase in processing speed and power, their components will generate even more heat that must be removed. Liquid cooling systems may be an efficient means to remove heat from electrical components by transferring heat away from the electrical components through the heating and cooling of a liquid. Typical liquid cooling devices may not be suitable or particularly efficient at removing adequate amounts of heat from electrical components, particularly where space and cost are concerns.

BRIEF DESCRIPTION OF THE DRAWINGS

FIG. 5 is a flow diagram of a process according to some embodiments.

DETAILED DESCRIPTION

The several embodiments described herein are provided solely for the purpose of illustration. Embodiments may include any currently or hereafter-known versions of the elements described herein. Therefore, persons in the art will recognize from this description that other embodiments may be practiced with various modifications and alterations.

Figure 1:
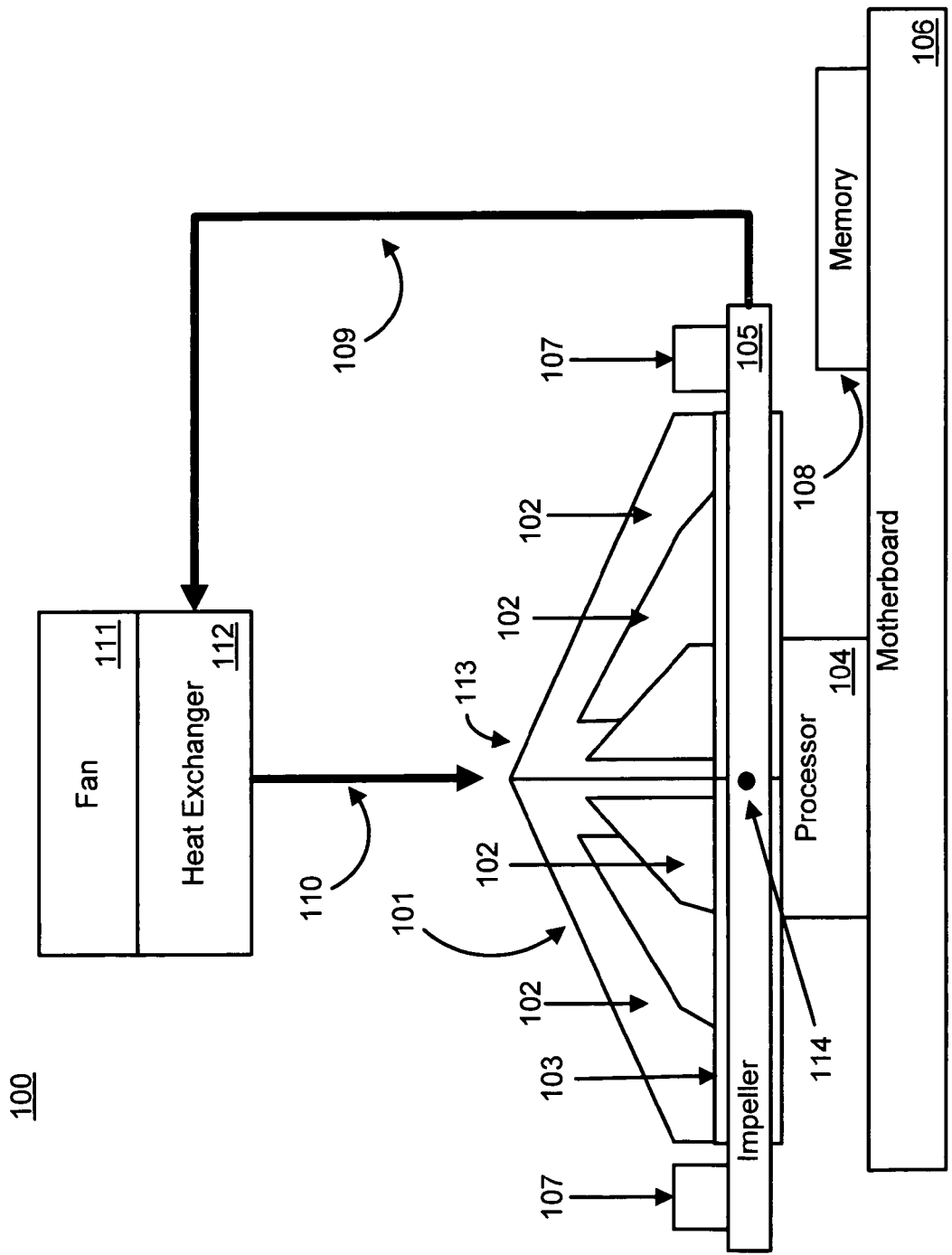
FIG. 1 illustrates a block diagram of a system according to some embodiments.

Now referring to FIG. 1, system 100 is illustrated according to some embodiments. In some embodiments, the system 100 may comprise a cooling system used in a variety of electrical devices such as, but not including, a personal computer, a server, or any other electrical device that is or becomes known. The system 100 may comprise a cold plate 101, an impeller 105, a processor 104, a motherboard 106, memory 108, a first flow path 109, a second flow path 110, a heat exchanger 112, and a fan 111.

The cold plate 101 may comprise a plurality of fins 102, a central portion 113, and a base 103, and the impeller 105 may comprise a plurality of blades 107. The cold plate 101 may be coupled to the processor 104 and, in some embodiments, the impeller 105 define a center point 114 and may surround the cold plate 101. In some embodiments, the cold plate 101 may be substantially circular and the impeller 105 may be substantially circular. In some embodiments, the impeller 105 may be a closed channel impeller comprising a top plate (not shown) and a bottom plate (not shown) to define a plurality of closed channels with the plurality of blades 107.

The first flow path 109 and the second flow path 110 may be, but are not limited to, any tube, hose, or conduit comprising rubber, plastic or metal that may allow circulation of a fluid within the system 100. For example, the first flow path 109 may be a rubber tube coupled to the impeller 105 and the heat exchanger 112 such that a fluid (e.g. water) may flow from the impeller 105 to the heat exchanger 112. The second flow path 110 may be, for example, a rubber tube coupled from the heat exchanger 112 and may supply a fluid to the cold plate 101. In some embodiments, the second flow path 110 may be coupled to an opening (not shown) disposed above the central portion 113 of the cold plate 101.

The motherboard 106 may be coupled to the processor 104 and the memory 108. The processor 104 may be any computer processor that is or may become known. The memory 108 may comprise integrated circuits and/or modules that store instructions to be executed by the processor 104. The memory 108 may comprise, according to some embodiments, any type of memory for storing data, such as a Single Data Rate Random Access Memory (SDR-RAM), a Double Data Rate Random Access Memory (DDR-RAM), or a Programmable Read Only Memory (PROM).

In some embodiments, the base 103 of the cold plate 101 may receive heat generated by the processor 104 and the central portion 113 of the cold plate 101 may receive a fluid from the second flow path 110. The received fluid may travel from the central portion 113 to the base 103 via the plurality of fins 102 and thereby absorb any heat dissipated by the plurality of fins 102 and the base 103.

During operation, the impeller 105 may spin around the cold plate 101 at an operational speed and the heated fluid exiting the cold plate 101 may be guided from the plurality of fins 102 into the impeller 105 by the plurality of blades 107. The impeller 105 may provide the heated fluid to the heat exchanger 112 via the first flow path 109. In some embodiments, a pump (not shown) may pump the fluid from the impeller 105 to the heat exchanger 112. In some embodiments, the impeller may be a part of a pump mechanism (not shown) and the impeller 105 may rotate around the cold plate 101.

The heat exchanger 112 may dissipate heat carried by the fluid and the fan 111 may facilitate the removal and/or dissipation of heat from the heat exchanger 112. The fan 111 may, in some configurations, direct air toward the heat exchanger 112 to facilitate forced convection to remove heat from the heat exchanger 112. In some embodiments, the fan 111 may direct air away from the heat exchanger 112.

Figure 2:
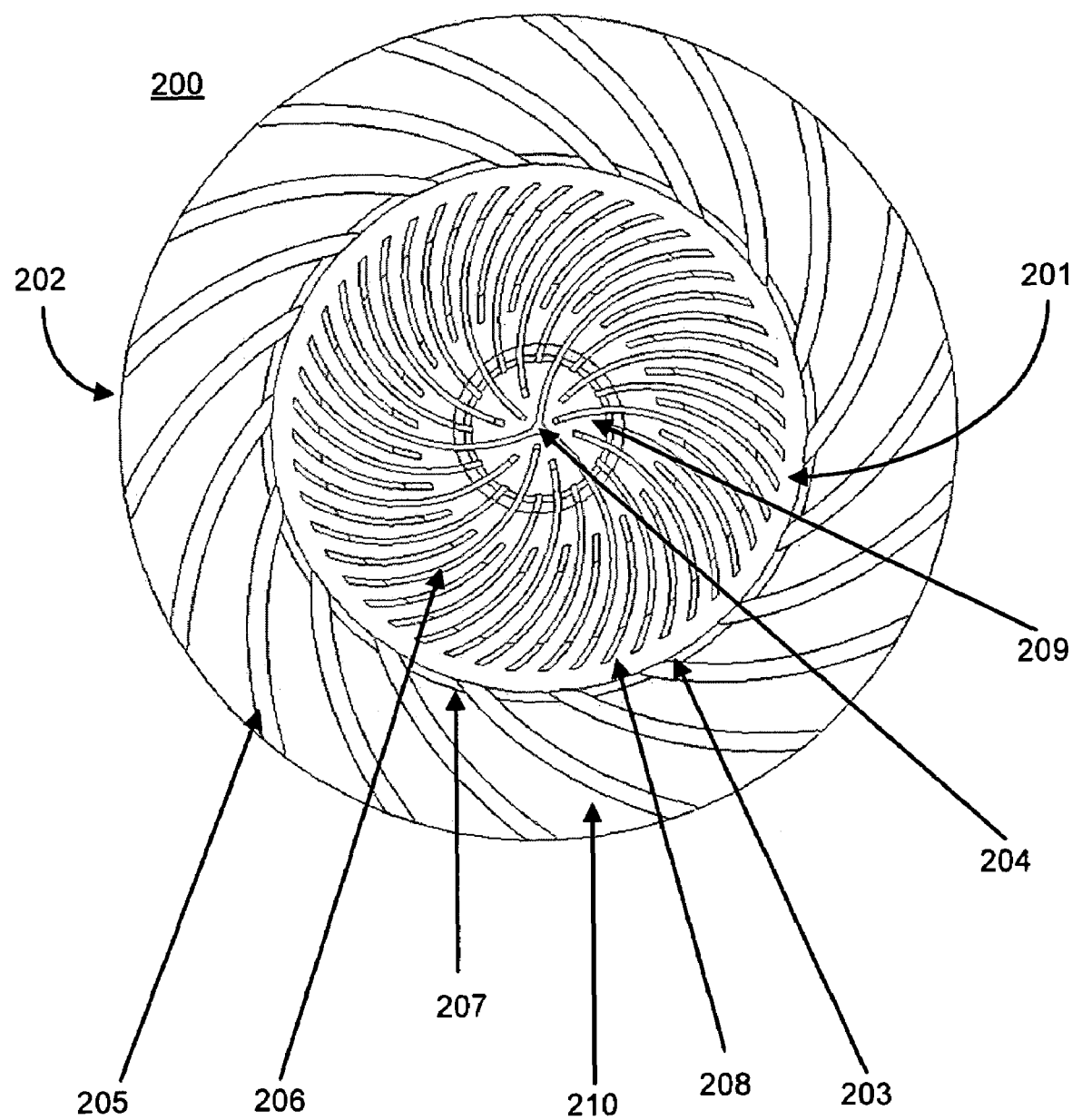
FIG. 2 is a top perspective view of an apparatus according to some embodiments.

FIG. 2 illustrates a top perspective view of an apparatus 200 according to some embodiments. The apparatus 200 may comprise a cold plate 201 and an impeller 202. The cold plate 201 may comprise a plurality of fins 206 and the impeller 202 may comprise a plurality of blades 205. In some embodiments, the cold plate 201 and the impeller 202 may be similar to the cold plate 101 and the impeller 102, respectively, as described in conjunction with FIG. 1.

Each of the plurality of fins 206 may be a curved radial fin. In some embodiments, the plurality of fins 206 may be substantially the same height. In some embodiments, the plurality of fins 206 may decrease in height from a central portion 209 as a radius of the cold plate 201 increases therefrom. In some embodiments, each of the plurality of fins 206 may define an output fluid velocity angle of a fluid exiting the cold plate 201 with respect to a center 204 of the cold plate 201. In some embodiments, the output fluid velocity angle may be aligned or substantially equal to the angle of the plurality of fins 206 with respect to the plurality of blades 205 and each of the plurality of fins 206 may define a same aligned or angle.

The impeller 202 may surround the cold plate 201 and each of the plurality of blades 205 may be a curved radial blade defining an angle with respect to the center 204 of the cold plate 201. An impeller inlet 207 and an impeller outlet 210 may be defined by adjacent blades 205. In some embodiments, the impeller 202 may be a high-speed impeller.

The impeller 202 may define an inner radius 203 loosely circumscribing an outer edge 208 of the cold plate 201. In some embodiments the inner radius 203 may be as close as one millimeter from the outer edge 208 so that the outer edge 208 does not impede the impeller 202 from spinning around the cold plate 201. In some embodiments, the cold plate 201 and the impeller 202 may be concentric so that the center 204 of the cold plate may be a center of the impeller 205.

Figure 3:
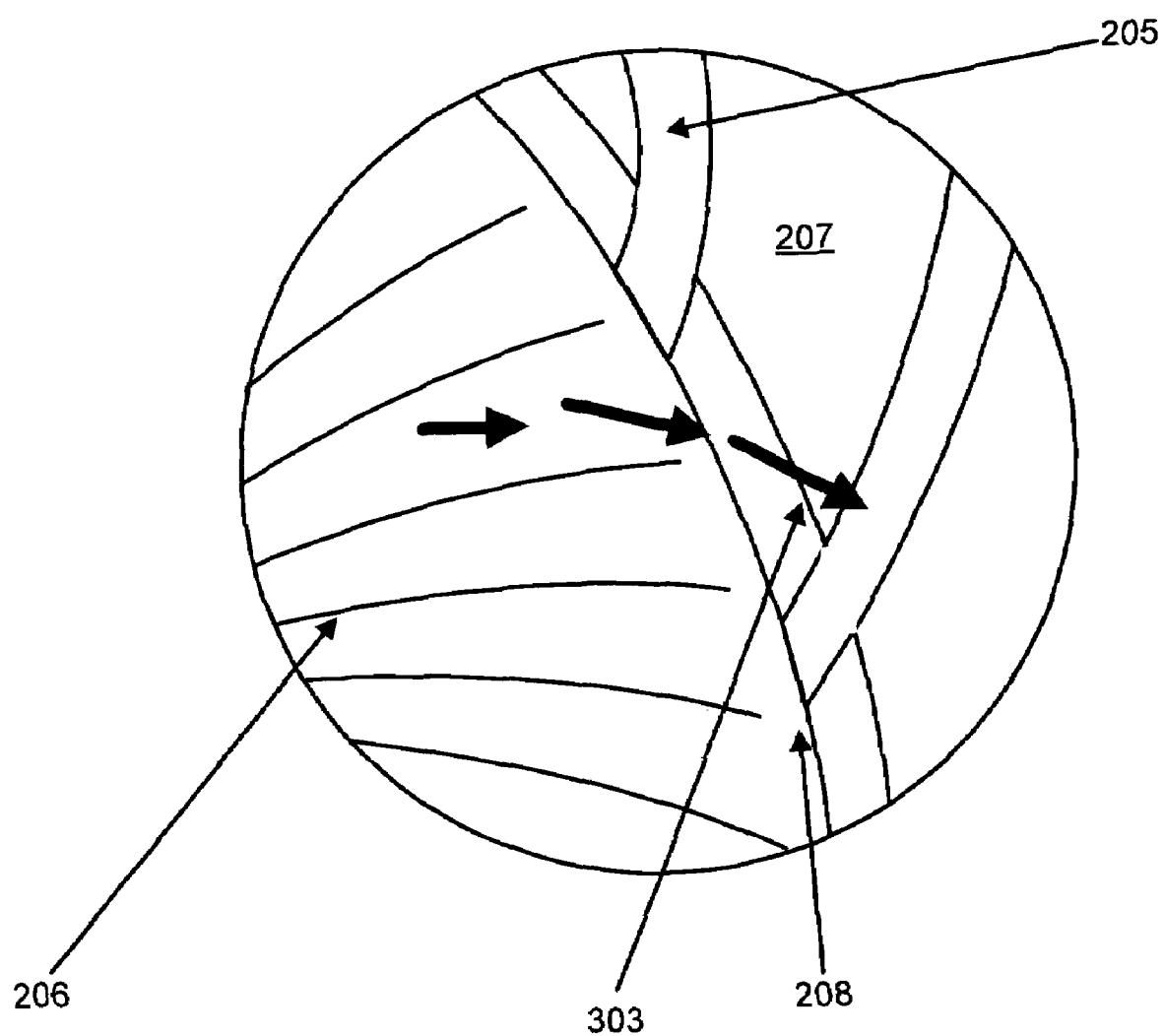
FIG. 3 is a top perspective view of an apparatus according to some embodiments.

FIG. 3 illustrates a flow 303 of fluid from cold plate 201 to impeller 202. A flow 303 of fluid may pass over an outer edge 208 of the cold plate 201 and enter the impeller 202 at an impeller inlet 207 located between two of the plurality of blades 205. A heated fluid may exit the cold plate 201 between a plurality of fins 206 at an output fluid velocity angle aligned with the impeller's 202 input velocity angle. The impeller's 202 input velocity angle may be based on an operational speed of the plurality of blades 205 and an angle of the plurality of blades 205 with respect to a center 204 of the impeller 202.

Aligning the impeller's 202 input velocity angle with the output fluid velocity angle defined by the plurality of fins 306 may reduce cavitation of a fluid received by the impeller 202 and improve efficiency of the blades ability to generate pressure and fluid flow. By sweeping the plurality of fins 306 of the cold plate 201 in the direction of impeller rotation, the fluid exiting the cold plate 201 may be more closely aligned with the impeller input velocity angle thus reducing or eliminating an abrupt pressure gradient on the fluid as it travels outward (e.g. radial) and tangentially reducing the risk of local vaporization of fluid which may cause cavitation and may also reduce pressure drop (e.g. turning and incidence losses) seen as part of an impeller's pumping mechanism.

Figure 4:
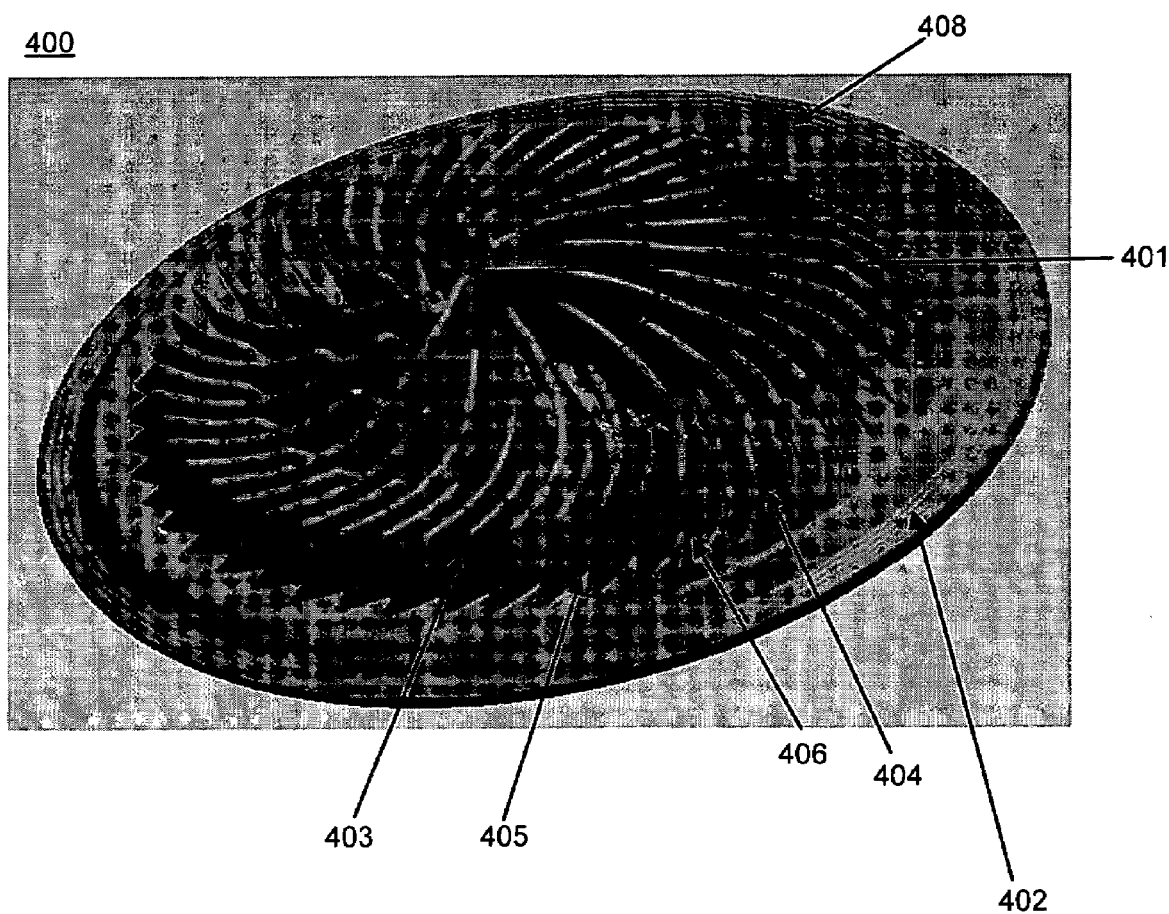
FIG. 4 is a top perspective view of an apparatus according to some embodiments.

Another embodiment of a cold plate 400 is illustrated in FIG. 4. In some embodiments, the cold plate 400 may be similar to the cold plate 101 of FIG. 1. The cold plate 400 may define a central portion 401, a plurality of first fins 403, a plurality of second fins 404, a plurality of third fins 406, a plurality of channels 405, and an outer edge 408. In some embodiments, the outer edge 408 may comprise grooves 402.

In some embodiments, each of the plurality of first fins 403, each of the plurality of second fins 404 and each of the plurality of third fins may be a curved radial fin. In some embodiments, the plurality of first fins 403 may be smaller in length than the plurality of second fins 404 and the plurality of second fins 404 may be smaller in length than the plurality of third fins 406. In some embodiments, one or more of the plurality of first fins 403 may be dispersed between two of the plurality of second fins 404. The plurality of channels 405 may be defined by two of the plurality of first fins 403, the plurality of second fins 404, or the plurality of third fins 406, or any combination thereof.

Now referring to FIG. 5, an embodiment of a process 500 is illustrated according to some embodiments. At 501 a fluid is received at a cold plate comprising a plurality of fins. For example, and referring back to FIG. 1, the cold plate 101 may receive a fluid at the central portion 113 from the second flow path 110 and the received fluid may travel from the central portion 113 to the base 103 of the cold plate 101 via the plurality of fins 102. In some embodiments, the cold plate is substantially circular and the plurality of fins decrease in height from a central of the cold plate as a radius of the cold plate increases.

Next, at 502, a fluid is transferred from the cold plate to an impeller, wherein the impeller comprises a plurality of blades, wherein an output fluid velocity angle of the cold plate is aligned with an impeller inlet velocity angle, and wherein the impeller inlet velocity angle is based on a speed of the plurality of blades and an angle of the plurality of blades with respect to a center of the impeller. For example, and again referring back to FIG. 1, the impeller 105 may spin around the cold plate 101 at an operational speed and the heated fluid exiting the cold plate 101 may be guided from the plurality of fins 102 into the impeller 105 by the plurality of blades 107. In some embodiments, the impeller and the cold plate are concentric and in some embodiments the impeller surrounds the cold plate.

The foregoing disclosure has been described with reference to specific exemplary embodiments. It will, however, be evident that various modifications and changes may be made thereto without departing from the broader spirit and scope set forth in the appended claims.

What is claimed is:

1. An apparatus comprising:
   a cold plate comprising a plurality of fins; and
   an impeller comprising a plurality of blades,
   wherein an output fluid velocity angle defined by the plurality of fins is aligned to an impeller inlet velocity angle, and wherein the impeller inlet velocity angle is based on an operational speed of the plurality of blades and an angle of the plurality of blades with respect to a center of the impeller.

2. The apparatus of claim 1, wherein the output fluid velocity angle of the cold plate is substantially equal to the angle of the plurality of fins with respect to the plurality of blades.

3. The apparatus of claim 1, wherein at least one of the plurality of fins comprises a curved radial fin and at least one of the plurality of blades comprises a curved radial blade.

4. The apparatus of claim 1, wherein the cold plate is substantially circular and the plurality of fins decrease in height from a central portion of the cold plate as a radius of the cold plate increases.

5. The apparatus of claim 1, wherein the impeller and the cold plate are concentric.

6. The apparatus of claim 1, wherein the impeller defines an inner radius.

7. The apparatus of claim 6, wherein the impeller surrounds the cold plate.

8. The apparatus of claim 1, wherein the aligned output fluid velocity angle defined by the plurality of fins is to reduce cavitation of a fluid received by the impeller.

9. An system comprising:
   a motherboard;
   a processor coupled to the motherboard;
   a double data rate memory module coupled to the motherboard;
   a cold plate coupled to the processor and comprising a plurality of fins; and
   an impeller comprising a plurality of blades,
   wherein an output fluid velocity angle defined by the plurality of fins is aligned to an impeller inlet velocity angle, and wherein the impeller inlet velocity angle is based on an operational speed of the plurality of blades and an angle of the plurality of blades with respect to a center of the impeller.

10. The system of claim 9, wherein the output fluid velocity angle of the cold plate is substantially equal to the angle of the plurality of fins with respect to the plurality of blades.

11. The system of claim 9, wherein at least one of the plurality of fins comprises a curved radial fin and at least one of the plurality of blades comprises a curved radial blade.

12. The system of claim 9, wherein the cold plate is substantially circular and the plurality of fins decrease in height from a central portion of the cold plate as a radius of the cold plate increases.

13. The system of claim 9, wherein the impeller and the cold plate are concentric.

14. The system of claim 9, wherein the impeller defines an inner radius.

15. The system of claim 14, wherein the impeller surrounds the cold plate.

16. The system of claim 9, wherein the aligned output fluid velocity angle defined by the plurality of fins is to reduce cavitation of a fluid received by the impeller.

17. A method comprising:
receiving fluid at a cold plate comprising a plurality of fins;
transferring fluid from the cold plate to an impeller, wherein the impeller comprises a plurality of blades, wherein an output fluid velocity angle of the cold plate is aligned with an impeller inlet velocity angle, and wherein the impeller inlet velocity angle is based on a speed of the plurality of blades and an angle of the plurality of blades with respect to a center of the impeller.

18. The method of claim 17, wherein the cold plate is substantially circular and the plurality of fins decrease in height from a central point of the cold plate as a radius of the cold plate increases.

19. The method of claim 17, wherein the impeller and the cold plate are concentric.

20. The method of claim 17, wherein the impeller surrounds the cold plate.

* * * * *